(12) United States Patent
Li et al.

(10) Patent No.: US 6,764,864 B1
(45) Date of Patent: Jul. 20, 2004

(54) BST ON LOW-LOSS SUBSTRATES FOR FREQUENCY AGILE APPLICATIONS

(75) Inventors: Hao Li, Chandler, AZ (US); Jeffrey M. Finder, Chandler, AZ (US); Yong Liang, Gilbert, AZ (US); Corey Overgaard, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/418,372

(22) Filed: Apr. 17, 2003

(51) Int. Cl.[7] .................. H01L 21/00; H01L 21/302; H01L 21/461; H01L 21/311
(52) U.S. Cl. ..................... 438/3; 438/689; 438/695
(58) Field of Search ...................... 438/3, 695, 509, 438/381, 689, 503

(56) References Cited

U.S. PATENT DOCUMENTS

| | | | | |
|---|---|---|---|---|
| 5,915,188 A | * | 6/1999 | Ramakrishnan et al. | .... 438/381 |
| 6,018,862 A | * | 2/2000 | Stageberg et al. | ....... 29/603.14 |
| 6,025,252 A | * | 2/2000 | Shindo et al. | .............. 438/509 |
| 6,638,872 B1 | * | 10/2003 | Croswell et al. | ............ 438/695 |

* cited by examiner

Primary Examiner—John F. Niebling
Assistant Examiner—Walter L. Lindsay, Jr.

(57) ABSTRACT

An exemplary system and method for providing a microwave regime, frequency-agile device is disclosed as comprising inter alia: a low-loss, insulating substrate (200); a layer of $SiO_2$ (210) over the surface of said substrate; and a layer of BST (220) deposited over the $SiO_2$ layer (210). Disclosed features and specifications may be variously controlled, configured, adapted or otherwise optionally modified to further improve or otherwise optimize frequency response or other material characteristics. Exemplary embodiments of the present invention representatively provide for integrated high-efficiency, low-loss microwave components that may be readily incorporated with existing technologies for the improvement of frequency response, device package form factors, weights and/or other manufacturing, device or material performance metrics.

14 Claims, 1 Drawing Sheet

BST ON LOW-LOSS SUBSTRATES FOR FREQUENCY AGILE APPLICATIONS

FIELD OF INVENTION

The present invention generally concerns compositions and methods for fabricating semiconducting devices; and more particularly, in various representative and exemplary embodiments, to deposition of BST on low-loss, insulating substrates for frequency agile applications.

BACKGROUND

An ordered and stable silicon (Si) surface is most desirable for subsequent epitaxial growth of single crystal thin films on silicon for numerous device applications, e.g., ferroelectrics or high dielectric constant oxides for non-volatile high density memory and logic devices. It is pivotal to establish an ordered transition layer on the Si surface, especially for subsequent growth of single crystal oxides, e.g., perovskites.

Some reported growth of these oxides, such as BaO and $BaTiO_3$ on Si(100) was based on a $BaSi_2$ (cubic) template by depositing one fourth monolayer of Ba on Si(100) using reactive epitaxy at temperatures greater than 850° C. See, for example: R. McKee et al., *Appl. Phys. Lett.* 59(7), pp 782–784 (Aug. 12, 1991); R. McKee et al., *Appl. Phys. Lett.* 63(20), pp. 2818–2820 (Nov. 15, 1993); R. McKee et al., *Mat. Res. Soc. Symp. Proc.*, Vol. 21, pp. 131–135 (1991); U.S. Pat. No. 5,225,031, issued Jul. 6, 1993, entitled "Process for Depositing an Oxide Epitaxially onto a Silicon Substrate and Structures Prepared with the Process"; and U.S. Pat. No. 5,482,003, issued Jan. 9, 1996, entitled "Process for Depositing Epitaxial Alkaline Earth Oxide onto a Substrate and Structures Prepared with the Process". However, atomic level simulation of this proposed structure indicates that it likely is not stable at elevated temperatures.

Growth of $SrTiO_3$ on silicon (100) using an SrO buffer layer has been accomplished. T. Tambo et al., *Jpn. J. Appl. Phys.*, Vol. 37 (1998), pp. 4454–4459. However, the SrO buffer layer was thick (100 Å), thereby limiting application for transistor films, and crystallinity was not maintained throughout the growth.

Furthermore, $SrTiO_3$ has been grown on silicon using thick metal oxide buffer layers (60–120 Å) of Sr or Ti (B. K. Moon et al., *Jpn. J Appl. Phys.*, Vol. 33 (1994), pp. 1472–1477); however such thick buffer layers would considerably limit applications to transistors. In the case of BST, use of amorphous buffer layers between substrates and crystalline BST films has been investigated (see, for example: Chang et al., *JAP* vol. 92, 1528); however, these approaches generally do not address thermal expansion problems nor loss problems associated with amorphous BST turning crystalline upon annealing. Accordingly, a composition and method for fabricating relatively thin, stable amorphous interfaces with BST for low-loss, frequency agile applications is desired.

SUMMARY OF THE INVENTION

In various representative aspects, the present invention provides a microwave regime frequency-agile device. An exemplary method for fabricating such a device is disclosed as comprising the steps of inter alia: providing an insulating substrate; providing a layer of silicon on the surface of the substrate; providing a layer of alkaline earth metal over the silicon layer; and heating the structure in the presence of oxygen to transform the crystalline silicon layer into amorphous silicon dioxide. Fabrication is relatively simple and straightforward. Additional advantages of the present invention will be set forth in the Detailed Description which follows and may be obvious from the Detailed Description or may be learned by practice of exemplary embodiments of the invention. Still other advantages of the invention may be realized by means of any of the instrumentalities, methods or combinations particularly pointed out in the claims.

BRIEF DESCRIPTION OF THE DRAWING

Representative elements, operational features, applications and/or advantages of the present invention reside inter alia in the details of construction and operation as more fully hereafter depicted, described and claimed—reference being made to the accompanying drawings forming a part hereof, wherein like numerals refer to like parts throughout. Other elements, operational features, applications and/or advantages will become apparent to skilled artisans in light of certain exemplary embodiments recited in the Detailed Description, wherein:

Those skilled in the art will appreciate that elements in the Figures are illustrated for simplicity and clarity and have not necessarily been drawn to scale. For example, the dimensions of some of the elements in the Figures may be exaggerated relative to other elements to help improve understanding of various embodiments of the present invention.

Furthermore, the terms 'first', 'second', and the like herein, if any, are used inter alia for distinguishing between similar elements and not necessarily for describing a sequential or chronological order. Moreover, the terms front, back, top, bottom, over, under, and the like in the Description and/or in the claims, if any, are generally employed for descriptive purposes and not necessarily for comprehensively describing exclusive relative position. Skilled artisans will therefore understand that any of the preceding terms so used may be interchanged under appropriate circumstances such that various embodiments of the invention described herein, for example, are capable of operation in other orientations than those explicitly illustrated or otherwise described.

DETAILED DESCRIPTION OF EXEMPLARY EMBODIMENTS

The following descriptions are of exemplary embodiments of the invention and the inventors' conceptions of the best mode and are not intended to limit the scope, applicability or configuration of the invention in any way. Rather, the following Description is intended to provide convenient illustrations for implementing various embodiments of the invention. As will become apparent, changes may be made in the function and/or arrangement of any of the elements described in the disclosed exemplary embodiments without departing from the spirit and scope of the invention.

A detailed description of an exemplary application, namely a system and method for providing a microwave regime frequency-agile device is presented as a specific enabling disclosure that may be readily generalized by skilled artisans to any application of the disclosed system and method in accordance with various embodiments of the present invention.

In general, strain and defects are substantially detrimental to the microwave properties of BST films for tunable microwave devices due inter alia to the local ferroelectricity introduced into the films. However, when deposited on a crystalline substrate, the bonding between two lattices generally operates to cause lattice-mismatch stress between crystal coordination sites, thereby predisposing the film to subsequent deterioration. Propagation of dislocations in the system may also be hindered by, for example, the interface between the substrate and film.

Figure 1:
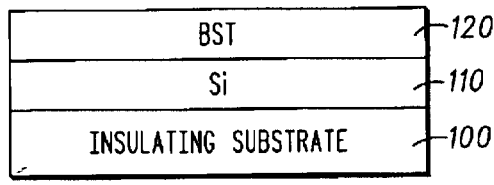
FIG. 1 representatively illustrates a cross-sectional view of an intermediate device structure in accordance with one exemplary aspect of the present invention.

It is generally known that crystalline BST films may be deposited on Si substrates with the subsequent introduction of an amorphous $SiO_2$ layer therebetween when annealed in $O_2$ at elevated temperatures. However, Si is generally regarded as a substantially inferior microwave material. This may ameliorated, in accordance with various representative aspects of the present invention, by combining BST layers with, for example, Si on Sapphire (SOS) technology. In one embodiment of the present invention, a Si film may be epitaxially grown on a sapphire substrate with the subsequent deposition of BST over the Si. Thereafter, the stack may be annealed in oxygen to form a low-loss $SiO_2$ layer in between BST and sapphire. The invention need not be limited to sapphire substrates alone; any insulating material capable of demonstrating low-loss properties for frequency agile application and high temperature characteristics capable of withstanding oxidation upon annealing may be used. For example, as generally illustrated in FIG. 1, insulating substrate 100 may comprise $Al_2O_3$, Si, $SiO_2$, MgO, $LaAlO_3$, any ceramic material, any composite material, etc. or such other material whether now known or hereafter described as demonstrating the desired properties herein disclosed and described. Thereafter, a layer of silicon 110 may be epitaxially or otherwise deposited or grown over insulating substrate 100. Alternatively, conjunctively or sequentially, a silicon/substrate composite may be commercially available as well. Any method of material deposition may be employed in accordance with various exemplary aspects of the present invention, such as, for example: MBE, CVD, PVD or any other method of material deposition now known or otherwise hereafter described in the art. Additionally, alternatively, conjunctively or sequentially, the silicon layer may also be wafer bonded to the substrate.

Figure 2:
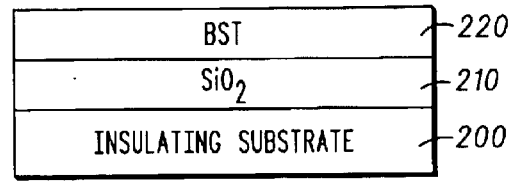
FIG. 2 representatively illustrates a cross-sectional view of an annealed device structure in accordance with another exemplary aspect of the present invention.

After the deposition of silicon 110 over the substrate 100, a layer of BST 120 may be deposited over silicon layer 110. The stack structure may then be annealed at a temperature of about 800° C. to about 1200° C., and most preferably at a temperature of about 1000° C. to for the BST 220/$SiO_2$ 210/substrate 200 structure generally depicted, for example, in FIG. 2.

In one exemplary embodiment, silicon layer 110 may comprise a thickness on the order of about less than 10 nm to about more than 500 nm, and most preferably about 50 nm. In another exemplary embodiment, BST layer 120 may comprise a thickness on the order of about less than 100 nm to about more than tens of microns, and most preferably about 500 nm.

Figure 3:
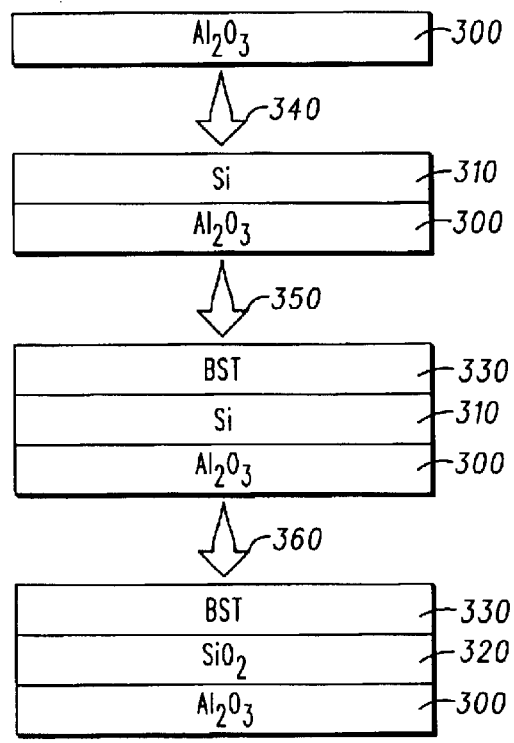
FIG. 3 representatively depicts an exemplary process flowchart in accordance with one embodiment of the present invention for forming the device structure representatively depicted, for example, in FIG. 2.

In one exemplary aspect, in accordance with a representative embodiment of the present invention, BST may be introduced into a composite structure with sapphire ($Al_2O_3$) in accordance with the method generally depicted, for example, in FIG. 3. A sapphire substrate 300 is provided for subsequent deposition of silicon 310 thereon (see step 340). BST 330 may then be epitaxially grown over the Si 310/sapphire substrate 300 structure (see step 350. Any method of material deposition may be employed in accordance with various exemplary aspects of the present invention, such as, for example: MBE, CVD, PVD or any other method of material deposition now known or otherwise hereafter described in the art. The BST 330/Si 310/sapphire 300 structure may then be annealed (see step 360) in an O2 environment at elevated temperature to form an amorphous layer of $SiO_2$ 320 intermediately disposed between BST layer 330 and the sapphire substrate 300. Again, the composite structure may be annealed at a temperature of about less than 800° C. to about more than 1200° C., and most preferably at a temperature of about 1000° C.

Introduction of an $SiO_2$ amorphous layer 320, 210 between the substrate 300, 200 and BST film 330, 220 generally operates to relieve lattice strain. Accordingly, dislocations may more easily and effectively propagate without the restriction of interface bonding. Moreover, $SiO_2$ 320 and sapphire 300 are both excellent low-loss microwave materials. In an exemplary embodiment of the present invention, a 500 nm layer of BST deposited over a 50 nm layer of silicon using a sapphire substrate was heated at about 1000° C. for approximately 24 hours to produce an intermediate $SiO_2$ layer between the BST and sapphire substrate.

Figure 4:
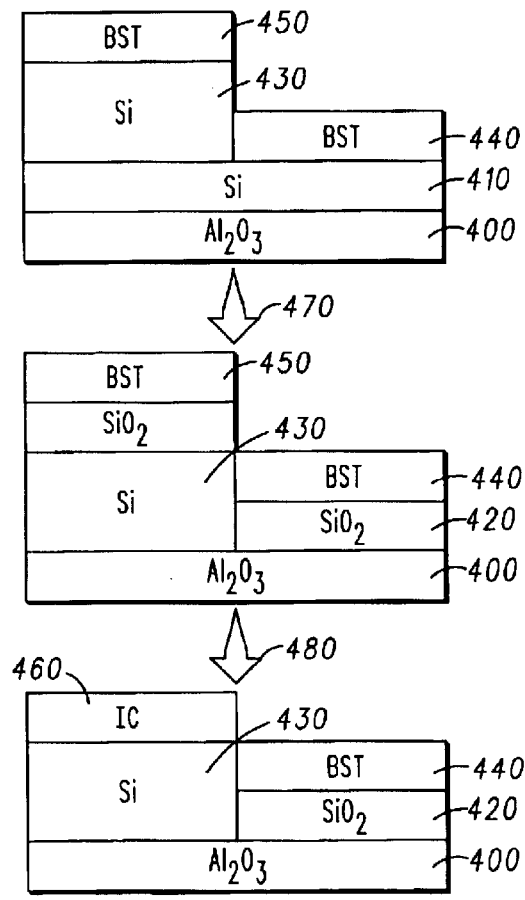
FIG. 4 representatively depicts an exemplary process in accordance with another embodiment of the present invention for providing an integrated circuit device component.

Various exemplary embodiment of the present invention may also be applied to the production of Si integrated circuits for RF applications, for example, by protecting the Si that is not desired for oxidization after the BST deposition and/or controlling the thickness of Si layer before the BST deposition, as generally depicted, for example, in FIG. 4. Beginning with, for example, a dual layered structure, as generally illustrated in FIG. 4, a first region of BST 450 may be deposited over an elevated second region of silicon 430, which in turn is deposited over a silicon 410 on sapphire 400 substrate. A second region of BST 440 may also be deposited over the silicon 410 on sapphire 400 substrate in a region substantially geminal to the region of the elevated first BST region 450. Annealing at a temperature regime as previously described (see step 470), amorphous silicon dioxide 420 may be introduced under both the first BST region 450 and the geminal second BST region 440. Thereafter, an etch may be performed to etch back (see step 480) the BST and $SiO_2$ in, for example, the first BST region 450 to expose a surface in which an integrated circuit 460 may be defined. Any method of etching may be used, such as, for example: a wet chemical etch; a dry chemical etch; and/or any other method of etching whether now known or otherwise hereafter described in the art.

In various representative and exemplary embodiments, in accordance with the invention, a variety of frequency agile device may be fabricated, such as, for example: tunable capacitors; phase-shifters; microwave reflection lenses; other tunable dielectric devices; varactors; voltage control oscillators; tunable filters; frequency mixers; frequency multipliers; phase array antennas; etc. as well as frequency agile devices for wireless LAN applications.

In the foregoing specification, the invention has been described with reference to specific exemplary embodiments; however, it will be appreciated that various modifications and changes may be made without departing from the scope of the present invention as set forth in the claims below. The specification and figures are to be regarded in an illustrative manner, rather than a restrictive one and all such modifications are intended to be included within the scope of the present invention. Accordingly, the scope of the invention should be determined by the claims appended hereto and their legal equivalents rather than by merely the examples described above. For example, the steps recited in any method or process claims may be executed in any order and are not limited to the specific order presented in the claims. Additionally, the components and/or elements recited in any apparatus claims may be assembled or otherwise operationally configured in a variety of permutations to produce substantially the same result as the present invention and are accordingly not limited to the specific configuration recited in the claims.

Benefits, other advantages and solutions to problems have been described above with regard to particular embodiments; however, any benefit, advantage, solution to problems or any element that may cause any particular benefit, advantage or solution to occur or to become more pronounced are not to be construed as critical, required or essential features or components of any or all the claims.

As used herein, the terms "comprises", "Comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted by those skilled in the art to specific environments, manufacturing specifications, design parameters or other operating requirements without departing from the general principles of the same.

We claim:

1. A method of fabricating a semiconductor structure, said method comprising the steps of:
   providing an insulating substrate having a surface;
   providing a layer of Si on the surface of said insulating substrate;
   providing a layer of an alkaline earth oxide on the Si layer; and
   heating the structure in the presence of $O_2$ to at least partially transform said Si layer into an $SiO_2$ layer disposed substantially between said insulating substrate and said alkaline earth metal layer.

2. The method of claim 1, wherein said insulating substrate comprises a low-loss, high-temperature material capable of withstanding oxidation.

3. The method of claim 2, wherein said insulating substrate comprises at least one of $Al_2O_3$, Si, $SiO_2$, a ceramic and a composite; and said alkaline earth metal layer is selected from the group consisting of barium, strontium, titanium and combinations thereof.

4. The method of claim 1, wherein said Si layer comprises a thickness of between about 10 nm to about 500 nm.

5. The method of claim 4, wherein said Si layer comprises a thickness of about 50 nm.

6. The method of claim 1, wherein said alkaline earth oxide layer comprises BST having a thickness of between about 100 nm to about 10 $\mu$.

7. The method of claim 6, wherein said BST layer comprises a thickness of about 500 nm.

8. The method of claim 1, wherein said steps of providing said layers comprise at least one of epitaxy, MBE, vapor deposition, CVD and PVD.

9. The method of claim 1, wherein said heating comprises annealing at a temperature between about 800° C. to about 1200° C.

10. The method of claim 9, wherein said heating comprises annealing at a temperature of about 1000° C.

11. The method of claim 1, further comprising the step of etching said structure.

12. The method of claim 11, wherein said etching comprises at least one of a wet chemical etch and a dry chemical etch.

13. The method of claim 11, further comprising the step of forming an integrated circuit.

14. A method of fabricating a microwave regime frequency-agile device, said method comprising the steps of:
   providing a substrate, said substrate comprising at least one of sapphire and quartz, said substrate having a surface;
   depositing a layer of Si on the surface of said substrate, said Si layer comprising a thickness of about 50 nm;
   depositing a layer of BST on said Si layer, said BST layer comprising a thickness of about 500 nm;
   heating the structure to a temperature of about 1000° C. in the presence of $O_2$ to at least partially transform said Si layer into $SiO_2$; and
   optionally etching said structure to define an integrated circuit.

* * * * *